(12) United States Patent
Tandon et al.

(10) Patent No.: US 7,577,172 B2
(45) Date of Patent: Aug. 18, 2009

(54) ACTIVE REGION OF A LIGHT EMITTING DEVICE OPTIMIZED FOR INCREASED MODULATION SPEED OPERATION

(75) Inventors: Ashish Tandon, Sunnyvale, CA (US); Kostadin Djordjev, San Jose, CA (US); Chao-Kun Lin, Fremont, CA (US); Michael R. T. Tan, Menlo Park, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 438 days.

(21) Appl. No.: 11/143,374

(22) Filed: Jun. 1, 2005

(65) Prior Publication Data
US 2006/0274801 A1 Dec. 7, 2006

(51) Int. Cl.
*H01S 5/00* (2006.01)
(52) U.S. Cl. .................. 372/43.01; 372/45.01
(58) Field of Classification Search ............... 372/43.01
See application file for complete search history.

(56) References Cited

U.S. PATENT DOCUMENTS

| | | | | |
|---|---|---|---|---|
| 4,839,899 A | * | 6/1989 | Burnham et al. | 372/45.01 |
| 5,198,682 A | * | 3/1993 | Wu et al. | 257/21 |
| 5,416,338 A | * | 5/1995 | Suzuki et al. | 257/21 |
| 5,544,188 A | * | 8/1996 | Takiguchi et al. | 372/45.01 |
| 5,636,236 A | | 6/1997 | Tada et al. | |
| 6,839,491 B2 | * | 1/2005 | Painter et al. | 385/50 |
| 6,879,612 B1 | | 4/2005 | Wasserbauer | |
| 6,955,933 B2 | * | 10/2005 | Bour et al. | 438/22 |
| 7,167,496 B1 | * | 1/2007 | Johnson | 372/44.011 |
| 7,266,279 B1 | * | 9/2007 | Yap et al. | 385/131 |
| 2003/0042478 A1 | * | 3/2003 | Cho et al. | 257/14 |
| 2005/0089074 A1 | * | 4/2005 | Koelle et al. | 372/50 |

FOREIGN PATENT DOCUMENTS

| | | |
|---|---|---|
| GB | 2 212 325 A | 7/1989 |
| JP | 05 102604 A | 6/1993 |
| JP | 06 152052 A | 8/1994 |
| JP | 07 162084 A | 10/1995 |
| JP | 09 283837 A | 1/1998 |
| JP | 2002 270894 A | 1/2002 |

* cited by examiner

Primary Examiner—Dung T Nguyen

(57) ABSTRACT

In accordance with the invention, increased maximum modulation speeds and improved hole distribution are obtained for light emitting devices. Barrier layers of a quantum well structure for a light emitting device are formed with varying barrier energy heights. Quantum well layers of the quantum well structure are formed between the barrier layers.

17 Claims, 8 Drawing Sheets

ACTIVE REGION OF A LIGHT EMITTING DEVICE OPTIMIZED FOR INCREASED MODULATION SPEED OPERATION

CROSS-REFERENCE TO RELATED APPLICATIONS

This patent application is related to co-pending U.S. patent application Ser. No. 10/885,952, filed on Jul. 6, 2004, entitled "Method For Increasing Maximum Modulation Speed Of A Light Emitting Device, And Light Emitting Device With Increased Maximum Modulation Speed And Quantum Well Structure Thereof," by Ashish Tandon, Michael R. T. Tan, and Ying-Lan Chang, which is commonly assigned and is incorporated herein by reference.

BACKGROUND

Light-emitting devices such as vertical-cavity surface-emitting lasers (VCSELs) are known in the art. The active region of a VCSEL has a quantum well structure composed of one or more quantum well layers interleaved with a corresponding number of barrier layers. Each quantum well layer forms a quantum well with the adjacent barrier layers. The quantum well captures and confines carriers (electrons and holes), which subsequently radiatively recombine to generate light.

The quantum well structure of a conventional VCSEL that generates light at a wavelength of 980 nm can have quantum well layers of indium gallium arsenide (InGaAs) and barrier layers of gallium arsenide (GaAs), or have quantum well layers of InGaAs and barrier layers of gallium arsenide phosphide (GaAsP), or have quantum well layers of InGaAs and barrier layers of aluminum gallium arsenide (AlGaAs). However, there are disadvantages associated with each of these approaches.

For example, conventional InGaAs/GaAs quantum well structures (where the InGaAs has an alloy composition of 20% In) provide insufficient confinement of the carriers, which can adversely affect the higher modulation speed of the typical VCSEL. One conventional way the confinement of carriers may be improved in the InGaAs/GaAs quantum well structures is to increase the amount of In within the quantum wells and reduce the quantum well thickness in order to keep the same emission wavelength. However, this approach adds additional strain to the system, which may negatively impact its reliability. Furthermore, the additional strain introduced in these structures also increases the splitting between the light hole and heavy hole bands, which can lead to increased intra-valence band scattering of carriers which in turn adversely affects modulation speed.

Conventional InGaAs/GaAsP quantum well structures typically have two disadvantages associated with them. For example, the interface between the GaAsP quantum well layer and the InGaAs barrier layer can become non-abrupt due to alloy intermixing introduced by different group V compositions. Additionally, the tensile strained GaAsP quantum well layers can have mid gap states that lead to lower confinement of the carriers than predicted by a simple band lineup model.

The InGaAs/AlGaAs quantum well structures have a disadvantage associated with them. For example, the InGaAs/AlGaAs quantum well structures have deeper quantum wells that contribute to non-uniform carrier distribution, especially for holes which have higher effective mass than the electrons.

SUMMARY

In accordance with the invention, increased maximum modulation speeds and improved hole distribution are obtained for light emitting devices. Barrier layers of a quantum well structure for a light emitting device are formed with varying barrier energy heights. Quantum well layers of the quantum well structure are formed between the barrier layers.

DETAILED DESCRIPTION

Carrier confinement is one factor that determines the material gain of the quantum well structure of a 980 nm VCSEL. Increased carrier confinement provides a material gain that increases the differential gain of the quantum well structure. Differential gain is defined as the differential of the material gain with respect to the injected carrier density. Moreover, the relaxation frequency of a VCSEL is directly proportional to the differential gain and, hence, to carrier capture in the quantum well structure of the VCSEL. The relaxation frequency characterizes the natural oscillation of electrons and photons when the VCSEL is generating light, and defines the maximum modulation speed of the VCSEL. Therefore, increasing carrier confinement provides a way to increase differential gain, to increase relaxation frequency, and, therefore, to increase the maximum modulation speed of the laser or VCSEL. Increasing the carrier confinement also improves the temperature performance of the VCSEL or other light-emitting device.

However, as light emitting devices, such as VCSELs, go to higher modulation speeds, the characteristics of the quantum well structure are subject to further scrutiny. As such, parameters that were not of interest previously are becoming increasingly important. Shortcomings in previous techniques become apparent as modulation speeds of the VCSELs increase. Also, increasing wavelength of the VCSEL demands a closer look at these shortcomings. For example, factors such as carrier confinement, carrier capture rate, and carrier escape rate become increasingly important.

In particular, carrier confinement is dependent on the ratio of capture rate to escape rate of carriers in the quantum well structure. Conventional 980 nm VCSELs have a quantum well structure composed of InGaAs quantum well layers and GaAs barrier layers in which the indium fraction in the InGaAs of the quantum well layers is less than 20 percent. Such a quantum well structure provides a carrier confinement that is insufficient to allow the VCSEL to attain a desired maximum modulation speed.

Terminology and Overview

Figure 1A:
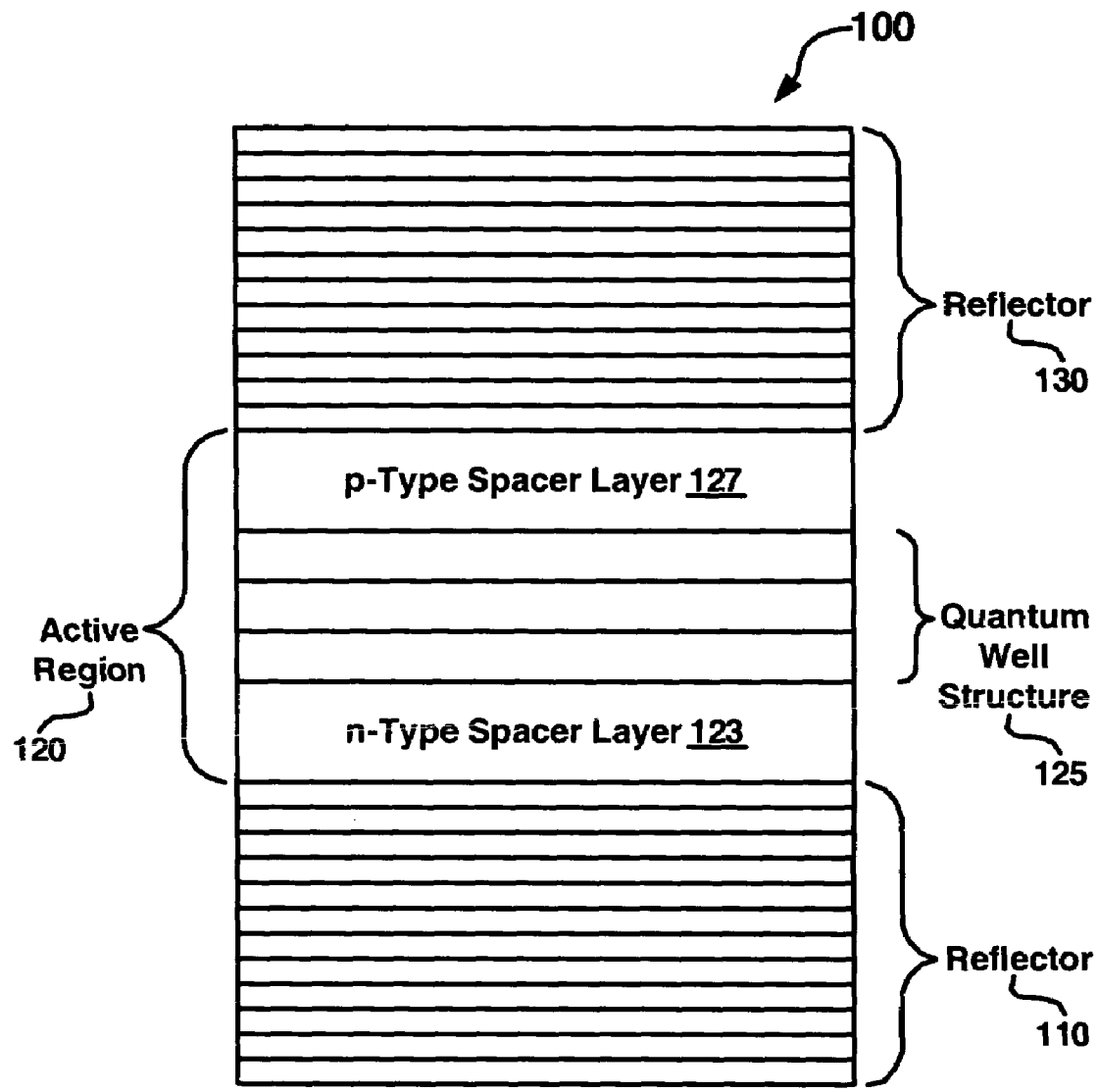
FIG. 1A is a cross-sectional view of a portion of an exemplary light-emitting device in accordance with the invention.

FIG. 1A is a cross-sectional view of a portion of an exemplary light-emitting device 100 in accordance with the invention. In the example shown, light-emitting device 100 is a vertical-cavity surface-emitting laser (VCSEL). Light emitting device 100 can include a first reflector 110 and a second reflector 130 with an active region 120 located between reflectors 110 and 130. Typically, the first reflector 110 and the second reflector 130 are distributed Bragg reflectors (DBRs).

First reflector 110 and second reflector 130 collectively define an optical cavity in which the active region 120 is located. Active region 120 is composed of a quantum well structure 125 sandwiched between an n-type spacer layer 123 and a p-type spacer layer 127. Typically, in a VCSEL in accordance with embodiments of the present invention, the quantum well structure 125 defines between one and five quantum wells. However, the invention is not limited to a quantum well structure that defines this number of quantum wells.

N-type spacer layer 123 and p-type spacer layer 127 respectively inject electrons and holes (collectively referred to as "carriers") into quantum well structure 125. A hole is a bond missing an electron. Holes are capable of moving in a semiconductor material but are typically less mobile than electrons. The carriers are captured by and are confined in the quantum wells defined by the quantum well structure 125. The electrons and holes confined in the quantum wells of the quantum well structure 125 recombine to generate light (e.g., at a wavelength of 980 nm).

VCSEL 100 is an example of a light-emitting device in accordance with the invention. However, the invention is not limited to VCSELs. Embodiments in accordance with the invention are applicable to other types of light-emitting devices, such as, but not limited to, edge-emitting lasers and optical amplifiers such as the optical gain medium of an electrically pumped external cavity laser.

Figure 1B:
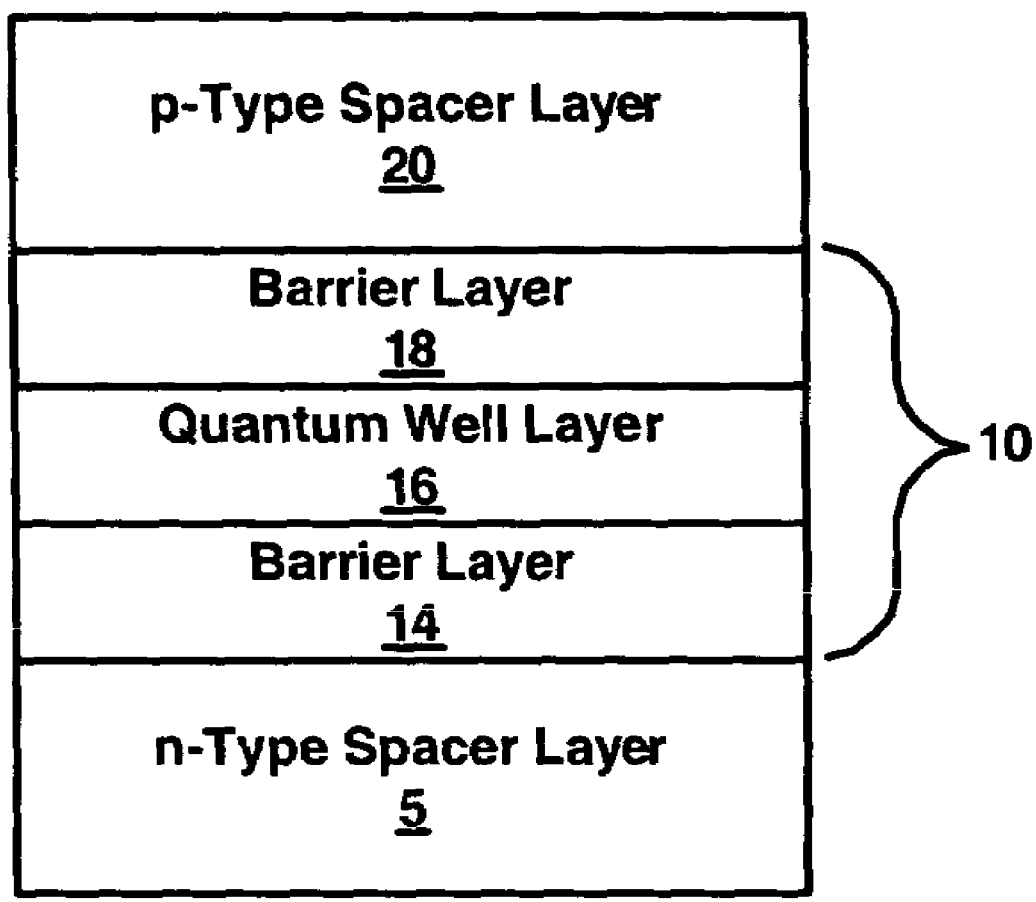
FIG. 1B is a cross-sectional view of the quantum well structure of a conventional light-emitting device.

As noted above, the active region of a light-emitting device, such as a 980 nm VCSEL, incorporates a quantum well structure that defines one or more quantum wells. FIG. 1B is a cross-sectional view of the active region of a conventional light-emitting device (not shown). The active region is composed of a quantum well structure 10 between an n-type spacer layer 5 and a p-type spacer layer 20. In the example shown in FIG. 1B, quantum well structure 10 is composed of a quantum well layer of a semiconductor material having a low band gap energy (a low band gap material) interleaved with barrier layers of a semiconductor material having a band gap energy greater than that of the low band gap material (a high band-gap material). Quantum well structure 10 defines a single quantum well and is composed of quantum well layer 16 sandwiched between barrier layers 14 and 18.

In other conventional light-emitting device embodiments in accordance with the invention, quantum well structure 10 is composed of N quantum well layers interleaved with N+1 barrier layers. The quantum well structure typically defines between one quantum well (N=1) and five quantum wells (N=5), although quantum well structures that define more than five quantum wells are known.

In a 980 nm VCSEL, the low band-gap material of quantum well layer 16 is indium gallium arsenide (InGaAs) and the high band gap material of barrier layers 14 and 18 is gallium arsenide (GaAs).

Figure 1C:
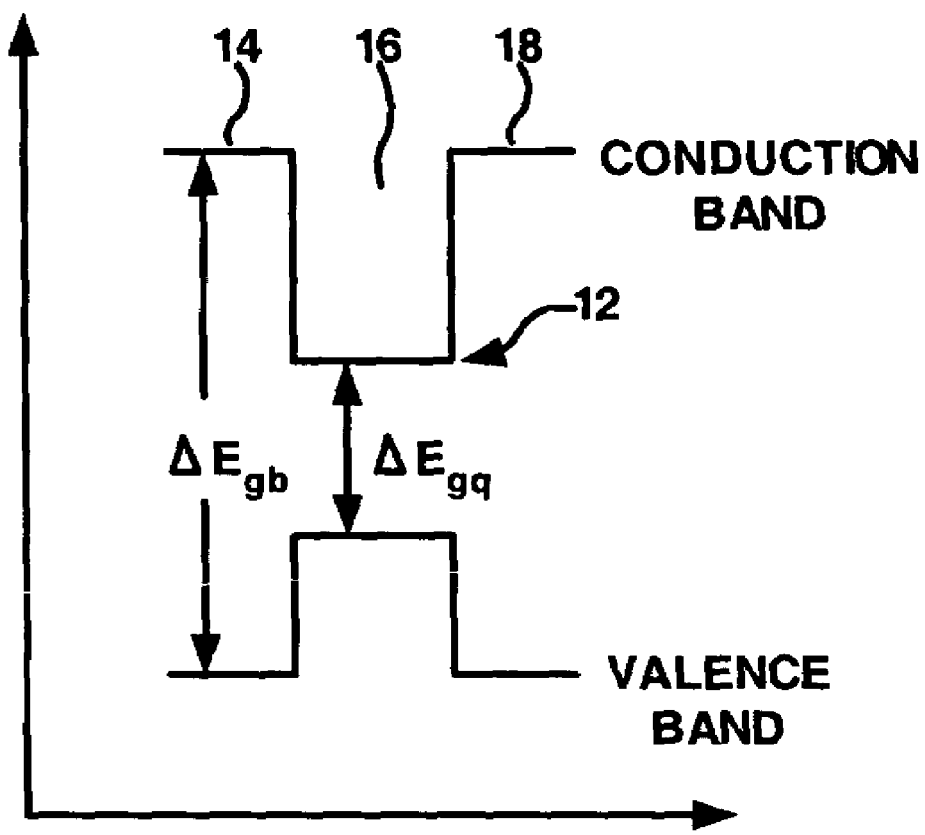
FIG. 1C is an energy diagram showing the band energy profile of the quantum well structure shown in FIG. 1B.

FIG. 1C is an energy diagram showing the band energy profile of quantum well structure 10 shown in FIG. 1B. The band energy profile shows the variation of band energy between the quantum well layer 16, barrier layer 14, and barrier layer 18 in the valence band and in the conduction band. FIG. 1C shows the difference in band gap energy (i.e., the difference between the conduction band energy and the valence band energy) between the low band-gap material of quantum well layer 16 and the high band-gap material of barrier layers 14 and 18. The difference in band gap energy between the quantum well layer 16 and the barrier layers 14 and 18 defines a quantum well 12. In the example shown, the band gap energy changes abruptly at the interfaces between the quantum well layer 16 and the barrier layers 14 and 18.

During operation of a light-emitting device incorporating quantum well structure 10, n-type spacer layer 5 and p-type spacer layer 20 respectively inject electrons and holes, as carriers, into the quantum well structure 10. A fraction of the carriers injected into the quantum well structure 10 is captured by and confined in quantum well layer 16. The electrons and holes confined in quantum well layer 16 recombine to generate light. Part of the light generated by this recombination is emitted by the light-emitting device.

As will be described in detail below, embodiments in accordance with the invention provide a method for increasing the maximum modulation speed of a light emitting device as well as having a more desirable hole distribution without introducing increased strain, and without necessarily reducing the thickness of the quantum well layers. In one embodiment, a higher maximum modulation speed along with desirable carrier distribution can be achieved by increasing the carrier confinement in the quantum well structure and by using multiple AlGaAs barrier layers in the active region, wherein each AlGaAs barrier layer has a different percentage of Al. As such, the barrier energy height for each of the barrier layers can be changed. More specifically, the barrier layers can be formed and arranged by barrier energy height such that they form a descending gradient of successive barrier energy heights. When arranged in this manner, the holes can more easily diffuse through the active region since each successive barrier layer energy is lower, thereby resulting in less holes being reflected by a barrier layer in the active region. Additionally, AlGaAs barrier layers provide increased carrier confinement by reducing the rate at which carriers escape from the quantum well. The greater band gap energy of AlGaAs compared with GaAs, the conventional barrier layer material, reduces the carrier escape rate. Moreover, AlGaAs with a relatively small fraction of aluminum has a lattice constant similar to that of GaAs, so using AlGaAs as the barrier layer material does not significantly change the strain in the quantum well structure.

Another mechanism by which the InGaAs/AlGaAs quantum well structure provides an increased carrier confinement relative to a conventional InGaAs/GaAs quantum well structure is that the InGaAs/AlGaAs quantum well structure has more abrupt interfaces between the InGaAs quantum well layer and the AlGaAs barrier layers. One contributor to the abrupt interface is the InGaAs of the quantum well layer and the AlGaAs of the barrier layers having the same group V sublattice. This tends to reduce interdiffusion between the quantum well layer and the adjacent barrier layers. Also, the Al—As bond is much stronger than the Ga—As bond, so an InGaAs/AlGaAs quantum well structure tends to have less interdiffusion and, hence, more abrupt interfaces, than a conventional InGaAs/GaAs quantum well structure. Thus, adding Al to GaAs in the barrier layers reduces interdiffusion and, hence, provides more abrupt interfaces. The more abrupt interfaces reduce mid gap states that cause non-radiant recombination.

Another mechanism by which the InGaAs/AlGaAs quantum well structure increases carrier confinement is that the InGaAs/AlGaAs quantum well structure has a greater offset factor $Q_c$, than a conventional quantum well structure. In the InGaAs/AlGaAs quantum well structure, the conduction band offset contributes more (65%) than the valence band offset (35%) to the band offset between the InGaAs quantum well layer and the AlGaAs barrier layers. This band line-up is favorable for a good confinement of electrons in the conduction band, and a good distribution of holes among the quantum wells in a multiple quantum well structure having barrier layers with descending energy heights. The good hole distribution additionally contributes to better confinement of electrons in the conduction band due to long-range electrostatic interaction forces between electrons and holes. The increased band gap energy of the barriers not only improves carrier confinement in the quantum wells, it also leads to a reduced carrier population in the higher energy states. Thus, the carrier concentration in the ground states is increased, which keeps the quasi Fermi levels close to the band edges at transparency.

Method for Improving Carrier Confinement and Hole Distribution

Figure 2:
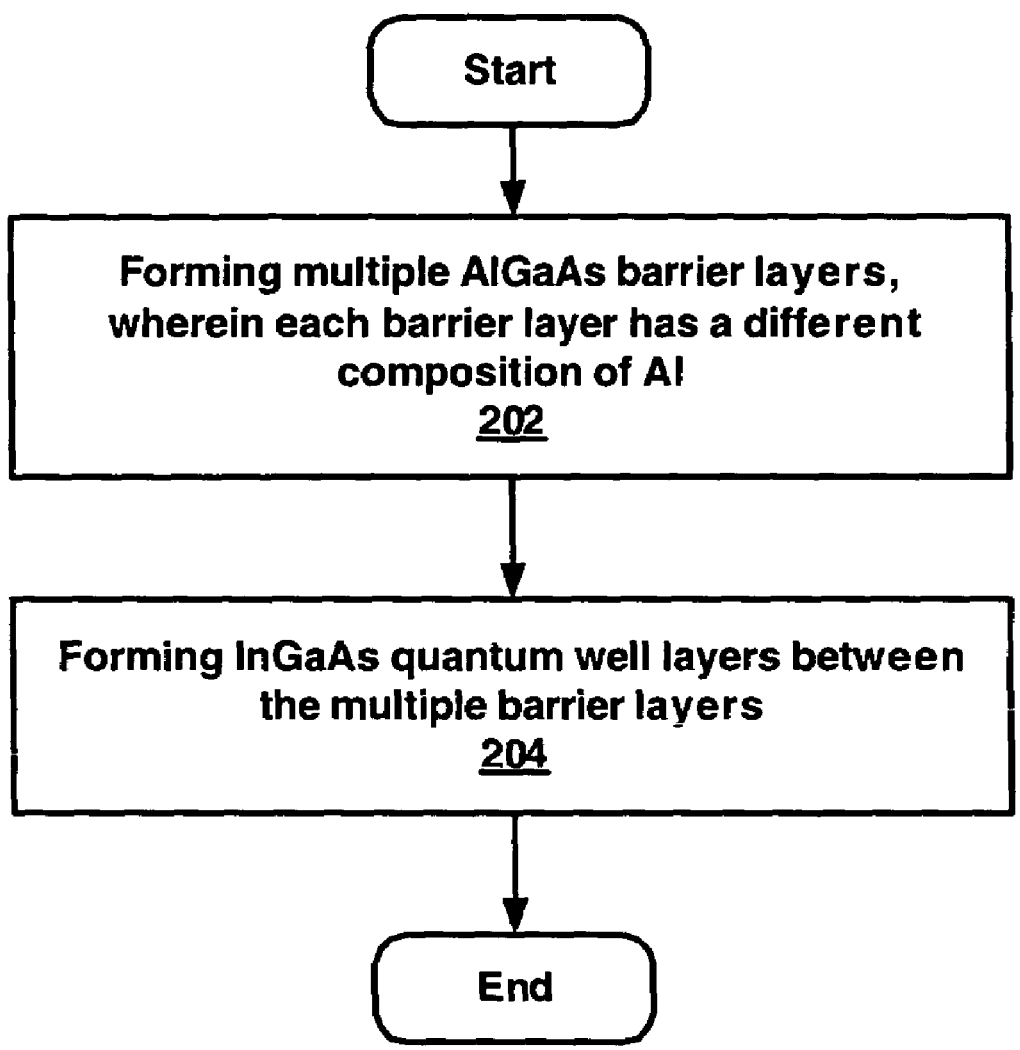
FIG. 2 is a flowchart of a method in accordance with embodiments of the invention.

FIG. 2 is a flowchart of method 200 in accordance with the invention for increasing the modulation speed of a light-emitting device while improving hole distribution in its active region. The increased modulation speed is due primarily to increased carrier confinement in the quantum wells of the light-emitting device while the improved hole distribution is due primarily to a multiple quantum well structure having barrier layers with descending energy heights. Note that the increased carrier confinement can be achieved by increasing the effective band gap energy of the barrier layers to form a deeper quantum well. Furthermore, by implementing the barrier layers with descending energy heights, fewer holes are reflected by the barrier layers thereby enabling better hole distribution.

Although specific operations are disclosed in method 200, such operations are exemplary. That is, method 200 may not include all of the operations illustrate by FIG. 2. Alternatively, method 200 may include various other operations and/or variations of the operations shown by FIG. 2. Likewise, the sequence of the operations of method 200 can be modified.

At operation 202 of FIG. 2, multiple barrier layers of $Al_xGa_{1-x}As$ can be formed, wherein each barrier layer has a different percentage of Al. The multiple barrier layers of $Al_xGa_{1-x}As$ at operation 202 can constitute part of the active region of a VCSEL or other light-emitting device, such as, but not limited to, an edge-emitting laser or an optical amplifier such as the optical gain medium of an electrically pumped external cavity laser. It is appreciated that operation 202 can be implemented in a wide variety of ways. In one embodiment in accordance with the invention, the multiple $Al_xGa_{1-x}As$ barrier layers can be formed at operation 202 such that the percentage of Al within each formed barrier layer progressively decreases (e.g., linearly or non-linearly) from one barrier layer to the next barrier layer, and so on.

For example, if three $Al_xGa_{1-x}As$ barrier layers are formed at operation 202, a first barrier layer can be formed of $Al_{0.2}Ga_{0.8}As$, a second barrier layer can be formed of $Al_{0.15}Ga_{0.85}As$, and a third barrier layer can be formed of $Al_{0.1}Ga_{0.9}As$. Alternatively, in another embodiment, if three $Al_xGa_{1-x}As$ barrier layers are formed at operation 202, a first barrier layer can be formed of $Al_{0.1}Ga_{0.9}As$, a second barrier layer can be formed of $Al_{0.05}Ga_{0.95}As$, and a third barrier layer can be formed of GaAs (which includes 0% of Al). It is understood that the percentage of Al within each of the $Al_xGa_{1-x}As$ barrier layers at operation 202 is not limited in any way to these recited embodiments. Instead, at operation 202, each barrier layer of $Al_xGa_{1-x}As$ can include any percentage of Al.

At operation 204, a quantum well layer of indium gallium arsenide (InGaAs) is formed between each pair of the barrier layers. In one embodiment, the barrier layers and the quantum well layers of method 200 can constitute part of the active region of a VCSEL or other light-emitting device, such as, but not limited to, an edge-emitting laser or an optical amplifier such as the optical gain medium of an electrically pumped external cavity laser. Operation 204 can be implemented in a wide variety of ways. In one embodiment, at operation 204, the percentage of In within each of the formed InGaAs quantum well layers can be unchanged or fixed, but is not limited to such. At the completion of operation 204, process 200 is ended.

Method 200 of FIG. 2 provides embodiments for increasing the maximum modulation speed of a light emitting device as well as enabling better hole distribution. In one embodiment, a higher maximum modulation speed along with desirable carrier (e.g., holes and/or electrons) distribution can be achieved by increasing the carrier confinement in the quantum well structure and by using multiple AlGaAs barrier layers in the active region, wherein each AlGaAs barrier layer has a different fraction (or percentage) of Al. By implementing the multiple barrier layers in this manner, the barrier energy height for each of the barrier layers can be changed. As such, the barrier layers can be formed and arranged by barrier energy height such that they form a tiered succession of reduced barrier energy heights. Consequently, the holes can more easily transfer and diffuse throughout the active region since each successive barrier layer energy is lower, thereby resulting in less holes being reflected by each barrier layer.

Subjecting the quantum well layer to compressive strain improves performance characteristics such as differential gain and maximum modulation speed. The compressive strain to which the quantum well layer is subjected to is increased by increasing the indium fraction in the InGaAs material of the quantum well layer. Increased strain in the quantum well layer theoretically increases differential gain of the quantum well and the VCSEL. Increased differential gain contributes favorably to an increased maximum modulation speed. In one embodiment in accordance with the invention, the indium fraction is approximately 20 percent, i.e., the material of each quantum well layer is $In_{0.2}Ga_{0.8}As$. Other embodiments in accordance with the invention can have quantum well layers of material having indium fractions of greater than 20 percent, i.e., the material of each quantum well layer is $In_xGa_{1-x}As$, where x>0.2.

Method 200 of FIG. 2 increases carrier confinement in each InGaAs quantum well layer to increase the modulation speed of the VCSEL, as described above. This is achieved by reducing the escape rate of carriers captured in each quantum well layer by utilizing $Al_xGa_{1-x}As$ (with varying percentages of Al) as the material of the barrier layers of the quantum well structure. More specifically, barrier layers of $Al_xGa_{1-x}As$ (with differing percentages of Al) reduce the escape rate of electrons captured in the conduction band of each quantum well layer.

A reduction in the escape rate of carriers captured in each InGaAs quantum well layer increases the carrier confinement factor of the quantum well structure in an embodiment. The carrier confinement factor scales the carrier density parameters of each quantum well layer to properly reflect the actual current density in each quantum well layer. As a result, the carrier confinement factor correctly contributes to the calculation of the differential gain of each quantum well layer, and ultimately the modulation speed of the VCSEL comprising a quantum well structure including multiple quantum well layers of InGaAs along with multiple barrier layers of $Al_xGa_{1-x}As$ (with differing percentages of Al). By increasing the carrier confinement factor, embodiments in accordance with the invention increase the maximum modulation speed of the VCSEL.

Current density was conventionally determined from the carrier density directly without any consideration of the carrier capture and escape characteristics of the quantum well structure. Consequently, calculating differential gain did not provide an accurate representation of the performance characteristics of the quantum well structure. In contrast, the present embodiment addresses carrier confinement in both carrier capture and carrier escape terms and provides an accurate representation of the performance characteristics of the quantum well structure in a given VCSEL.

By using $Al_xGa_{1-x}As$ as the material of the barrier layers (with varying fractions of Al for each layer), the carrier confinement factor is increased by reducing the escape rate of carriers captured in each InGaAs quantum well layer. Increasing the carrier confinement factor of each quantum well layer increases the maximum modulation speed of the VCSEL.

The carrier confinement factor is determined by the ratio of the carrier capture rate $\gamma_{capture}$ to the carrier escape rate $\gamma_{escape}$, as shown in Equation 1:

$$\text{Carrier Confinement Factor} = \frac{\gamma_{capture}}{\gamma_{escape}} \quad (1)$$

The carrier capture rate $\gamma_{capture}$ is described as the probability of carrier capture, and is inversely proportional to the time of carrier capture. In other words, the higher the carrier capture rate, the higher the probability of carrier capture, and the shorter the time needed to capture the carrier in each quantum well. Also, the carrier escape rate $\gamma_{escape}$ is described as the probability of carrier escape, and is inversely proportional to the time of carrier escape. A reduction in the carrier escape rate leads to a reduction in the probability of captured carriers escaping, and indicates that it takes longer for carriers captured in each quantum well to escape.

Reducing the carrier escape rate $\gamma_{escape}$ increases the carrier confinement factor, in accordance with the invention. The carrier escape rate is reduced by increasing the energy difference between the conduction band of each quantum well layer and that of the adjacent barrier layers to better confine captured electrons in the conduction band of each quantum well layer. That is, embodiments in accordance with the invention increase this energy difference by using a material with an increased band gap energy as the material of the barrier layers sandwiching each quantum well layer. The material of the barrier layers is $Al_xGa_{1-x}As$, which has a greater conduction band energy than GaAs, the conventional barrier layer material. Specifically, the energy difference between the conduction band energy of each quantum well layer and that of the adjacent barrier layers is increased from approximately 80 meV obtained with conventional GaAs barrier layers to over 100 meV obtained with the $Al_xGa_{1-x}As$ barrier layers.

In a light emitting device in accordance with the invention, the $Al_xGa_{1-x}As$ barrier layers provide increased electron carrier confinement in each quantum well layer, and consequently, a reduction in the carrier escape rate $\gamma_{escape}$. As an added benefit, the increased barrier height of the $Al_xGa_{1-x}As$ barrier layers compared to conventional GaAs barrier layers also increases the carrier capture rate $\gamma_{capture}$. Thus, the $Al_xGa_{1-x}As$ barrier layers in accordance with the invention increase the carrier confinement factor by increasing the carrier capture rate and reducing the carrier escape rate.

Also, as an added benefit, the $Al_xGa_{1-x}As$ barrier layers increase the differential gain of the TCSEL. The increase in differential gain is a result of the increase in the carrier confinement. As described above, the above-described increase in the carrier confinement factor provides the increase in carrier confinement.

In addition, the increased band gap energy of the $Al_xGa_{1-x}As$ material of the barrier layers allows the thickness of each InGaAs quantum well layer and its associated $Al_xGa_{1-x}As$ barrier layers to be proportionately reduced without affecting the differential gain. A decrease in the thickness of each quantum well layer reduces the carrier confinement, but this reduction is offset by the above-described increase in carrier confinement resulting from the greater band gap energy of $Al_xGa_{1-x}As$ as the material of the barrier layers.

Carrier confinement is one factor that determines the material gain of each InGaAs quantum well layer of the quantum well structure of the VCSEL. Increased carrier confinement in each quantum well leads to material gain properties that provide an overall increase in the differential gain of the quantum well structure. In other words, the increased carrier confinement increases the rate at which material gain changes with current density. Carrier density is defined as the product of current density in each quantum well structure and the carrier confinement factor, as shown in Equation 2.

$$\text{Carrier Density}=(\text{Current Density})\times(\text{Carrier Confinement Factor}) \quad (2)$$

The slope of the material gain versus current density characteristic determines the differential gain. In turn, the relaxation frequency of the quantum well is directly proportional to the differential gain. The relaxation frequency characterizes the natural oscillation of electrons and photons when the VCSEL is generating light, and limits the modulation speed of the VCSEL. The higher the relaxation frequency, the higher the maximum modulation speed of the VCSEL. Thus, increasing the carrier confinement increases the slope of material gain versus current density characteristic, i.e., increases the differential gain. The increased differential gain increases the relaxation frequency, which in turn increases the maximum modulation speed of the VCSEL.

Figure 3A:
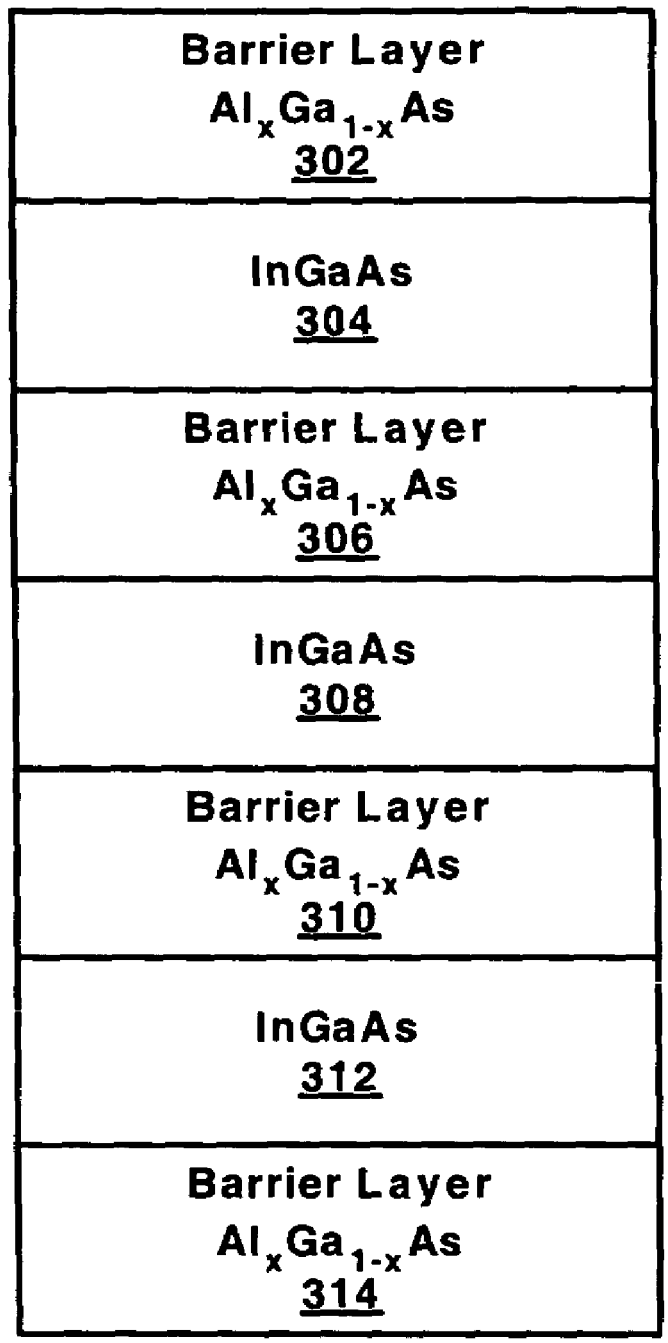
FIG. 3A is a diagram of a quantum well structure in accordance with the invention.

Quantum Well Structure Providing Improved Carrier Confinement and Hole Distribution FIG. 3A is a schematic diagram of a quantum well structure 300 that provides improved carrier confinement and hole distribution in accordance with the invention. In one embodiment, quantum well structure 300 forms part of the active region of a VCSEL or other light-emitting device, such as, but not limited to, an edge-emitting laser or an optical amplifier such as the optical gain medium of an electrically pumped external cavity laser. More specifically, quantum well structure 300 forms part of the active region of a VCSEL that generates light in the wavelength range of, but not limited to, approximately 960 nm to approximately 1100 nm.

Quantum well structure 300 can be composed of quantum well layers 304, 308, and 312 of InGaAs and barrier layers 302, 306, 310, 314 of $Al_xGa_{1-x}As$, wherein each of barrier layers can include a different percentage of Al. Barrier layers 302 and 306 sandwich quantum well layer 304, while barrier layers 306 and 310 sandwich quantum well layer 308. Additionally, barrier layers 310 and 314 sandwich quantum well layer 312. A lattice mismatch exists between the $Al_xGa_{1-x}As$ of the barrier layers (e.g., 310 and 314) and the InGaAs of the quantum well layers (e.g., 312) so that quantum well structure 300 is strained. Specifically, the indium in the InGaAs of the quantum well layers 304, 308, and 312 subject them to a compressive strain that changes the characteristics of their material in a way that increase the differential gain of the quantum well structure 300. Note that the fraction of indium in the InGaAs quantum well layers 304, 308, and 312 determines the magnitude of the strain and can be, but is not limited to, approximately equal to or greater than 20 percent.

The barrier layers 302, 306, 310 and 314 that sandwich InGaAs quantum well layer 304, 308 and 312, respectively, are composed of aluminum gallium arsenide $Al_xGa_{1-x}As$, wherein the fraction of Al within the barrier layers 302, 306, 310, and 314 can vary. Note that an aluminum fraction of greater than 5 percent in the $Al_xGa_{1-x}As$ of barrier layers 302, 306, 310 and 314 increases the barrier energy height between the conduction band of InGaAs quantum well layers 304, 308 and 312 and the conduction band of $Al_xGa_{1-x}As$ barrier layers 302, 306, 310 and 314, as described above with reference to FIG. 2.

Moreover, the aluminum fractions in the $Al_xGa_{1-x}As$ material of barrier layers 302, 306, 310 and 314 can be low enough that material with good electrical and optical properties can be grown using a standard epitaxial growth process. For example, the epitaxial growth process can be molecular beam epitaxy (MBE) in accordance with one embodiment of the invention. In an embodiment in accordance with the invention, the epitaxial growth process can be metal-organic chemical vapor deposition (MOCVD).

It is noted that in another embodiment, quantum well structure 300 can be modified such that it can be composed of quantum well layers 304, 308, and 312 of GaAs and barrier layers 302, 306, 310, 314 of $Al_xGa_{1-x}As$, wherein at least two barrier layers can include a different percentage of Al. Barrier layers 302 and 306 sandwich quantum well layer 304, while barrier layers 306 and 310 sandwich quantum well layer 308. Also, barrier layers 310 and 314 sandwich quantum well layer 312. Composed in this manner, the quantum well structure 300 can form part of the active region of a VCSEL that generates light in the wavelength range of, but not limited to, approximately 850 nm.

In another embodiment, quantum well structure 300 can be modified such that it can be composed of quantum well layers 304, 308, and 312 of $In_aGa_{1-a}As_bP_{1-b}$ and barrier layers 302, 306, 310, 314 of $In_xGa_{1-x}As_yP_{1-y}$, wherein at least two barrier layers can include a different percentage of In and/or As. For example, barrier layer 314 can be implemented with $In_{0.7}Ga_{0.3}As_{0.53}P_{0.47}$, barrier layer 310 can be implemented with $In_{0.7}Ga_{0.3}As_{0.51}P_{0.49}$, and barrier layers 306 and 302 can be implemented with $In_{0.7}Ga_{0.3}As_{0.49}P_{0.51}$. Note that if barrier layers 302, 306, 310, 314 are implemented in this manner and if quantum well layers 304, 308, and 312 are each implemented with $In_{0.76}Ga_{0.24}As_{0.78}P_{0.22}$, the quantum well structure 300 can form part of the active region of a VCSEL that generates light in the wavelength range of, but not limited to, approximately 1550 nm. Alternatively, if quantum well layers 304, 308, and 312 are each implemented with $In_{0.79}Ga_{0.21}As_{0.58}P_{0.42}$, and if at least two of barrier layers 302, 306, 310, 314 are implemented with a different percentage of In and/or As near the material $In_{0.73}Ga_{0.27}As_{0.35}P_{0.65}$, the Guantum well structure 300 Carl form part of the active region of a VCSEL that generates light in the wavelength range of, but not limited to, approximately 1300 nm.

Figure 3B:
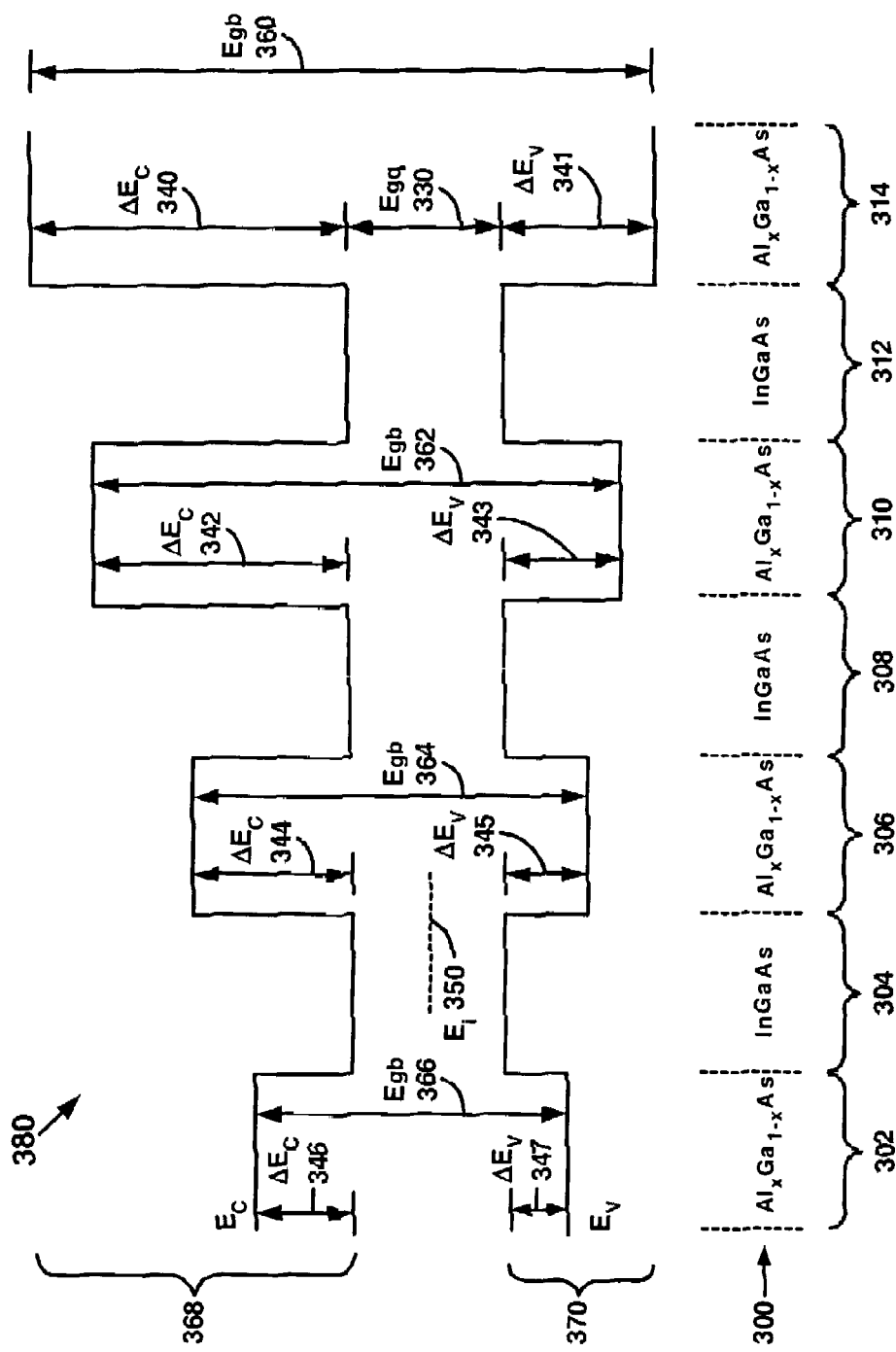
FIG. 3B is an energy diagram in accordance with an embodiment of the invention of the quantum well structure shown in FIG. 3A.

FIG. 3B is an energy diagram 380 illustrating the band energy profile of quantum well structure 300 shown in FIG. 3A in an embodiment in accordance with the invention. The energy diagram 380 additionally shows the structural elements of quantum well structure 300. Note that an n-type spacer layer (e.g., FIG. 1A, 123) can be located to the left of barrier layer 302 while a p-type spacer layer (e.g., FIG. 1A, 127) can be located to the right of barrier layer 314. The energy diagram 380 is illustrative of a flat-band condition in which no electric field is applied to quantum well structure 300. The band gap energy $E_{gq}$ 330 is shown for the transition between the lowest-energy subbands (n=1) for an electron and a heavy-hole in the flat-band condition of quantum well layers 304, 308 and 312. The band gap energy $E_{gb}$ 360 is shown for barrier layer 314 along with the band gap energy $E_{gb}$ 362 for barrier layer 310. Also shown in the band gap energy $E_{gb}$ 364 for barrier layer 306 along with the band gap energy $E_{gb}$ 366 for barrier layer 302. The upper portion 368 of the energy diagram 380 shows the conduction band energy $E_c$ of the barrier layers 302, 306, 310 and 314 along with the quantum well layers 304, 308 and 312. The lower portion 370 of the energy diagram 380 shows the valence band energy $E_v$ of the barrier layers 302, 306, 310 and 314 along with the quantum well layers 304, 308 and 312.

In addition, FIG. 3B shows the barrier height $\Delta E_c$ 340 between the conduction band of the InGaAs quantum well layer 312 and the conduction band of the $Al_xGa_{1-x}As$ barrier layer 314. The energy diagram 380 also shows the barrier height $\Delta E_c$ 342 between the conduction band of quantum well layers 308 and 312 and the conduction band of barrier layer 310. Furthermore, energy diagram 380 shows the barrier height $\Delta E_c$ 344 between the conduction band of quantum well layers 304 and 308 and the conduction band of barrier layer 306. The energy diagram 380 further shows the barrier height $\Delta E_c$ 346 between the conduction band of quantum well layer 304 and the conduction band of barrier layer 302. Note that the barrier heights $\Delta E_c$ 340, 342, 344 and 346 are progressively reduced in height which can be caused by a reduction in the percentage of Al within each of the $Al_xGa_{1-x}As$ barrier layers 302, 306, 310 and 312. For example, barrier height $\Delta E_c$ 342 is less than barrier height $\Delta E_c$ 340 indicating that $Al_xGa_{1-x}As$ barrier layer 310 has a lower percentage of Al than $Al_xGa_{1-x}As$ barrier layer 314. As such, electrons can more easily diffuse through the active region of quantum well structure 300 since each successive barrier layer energy 340, 342, 344 and 346 is lower, thereby resulting in effective electron confinement in the active region.

The energy diagram 380 also shows the barrier height $\Delta E_v$ 341 between the valence band of the InGaAs quantum well layer 312 and the valence band of the $Al_xGa_{1-x}As$ barrier layer 314. Moreover, the energy diagram 380 shows the barrier height $\Delta E_v$ 343 between the valence band of quantum well layers 308 and 312 and the valence band of barrier layer 310. Furthermore, energy diagram 380 shows the barrier height $\Delta E_v$ 345 between the valence band of quantum well layers 304 and 308 and the valence band of barrier layer 306. The energy diagram 380 also shows the barrier height $\Delta E_v$ 347 between the valence band of quantum well layer 304 and the valence band of barrier layer 302. Note that the barrier heights $\Delta E_v$ 341, 343, 345 and 347 are also progressively reduced in height which can be caused by a reduction in the percentage of Al within each of the $Al_xGa_{1-x}As$ barrier layers 302, 306, 310 and 312. For example, barrier height $\Delta E_v$ 347 is less than barrier height $\Delta E_v$ 345 indicating that $Al_xGa_{1-x}As$ barrier layer 302 has a lower percentage of Al than $Al_xGa_{1-x}As$ barrier layer 306. As such, holes can more easily diffuse through the active region of quantum well structure 300 since each successive barrier layer energy 341, 343, 345 and 347 is lower, thereby resulting in improved hole distribution in the active region.

The barrier heights 340-347 achieved in accordance with the embodiment can all be greater than a conventional quantum well structure using GaAs barrier layers, and can be obtained without additional strain in quantum well structure 300. As stated above, excessive strain will cause a reduction in performance and reliability of the quantum well structure 300. The increase in barrier heights 340-347 can be achieved without additional strain in quantum well structure 300 because the lattice constants of aluminum arsenide and gallium arsenide are similar. Consequently, adding aluminum to gallium arsenide does not significantly change the strain in quantum well structure 300.

Additionally, the increase in barrier heights 340-347 can be achieved in accordance with the invention without causing any mid gap states to form in the InGaAs quantum well layers 304, 308 and 312. FIG. 3B illustrates a mid gap state $E_i$ 350 that could potentially exist in quantum well structure 300. The energy $E_i$ 350 of the mid gap state differs from the valence band energy of quantum well layer 320 by approximately one half the value of the band gap energy $E_{gq}$ 330 of each of the quantum well layers 304, 308 and 312. Recombination at any mid gap state that exists increases non-radiative recombination. As described above, mid gap states are caused by the increased strain that results when the indium fraction in each quantum well layer is increased in an effort to increase barrier height $\Delta E_c$ 340. However, in accordance with the invention, barrier layers 302, 306, 310 and 314 of $Al_xGa_{1-x}As$ can increase their respective barrier heights 340-347 without increasing strain in the quantum well structure 300 and without promoting the formation of mid gap states. The non-radiative recombination that can occur when such states exist is therefore prevented.

Using $Al_xGa_{1-x}As$ as the material of the barrier layers 302, 306, 310 and 314 can also increase their respective barrier heights 340-347 without incurring intravalence band scattering. The additional strain that results from the conventional approach of using an indium fraction greater than 20 percent (e.g., in conventional InGaAs/GaAs quantum well structures) to increase the barrier height leads to a wider separation of the light hole and heavy hole states in the valence band. The wider separation leads to gain suppression in the quantum well structure since it takes longer for light holes to fall to the ground state occupied by the heavy holes. Radiative recombination occurs only with the heavy holes. However, barrier layers 302, 306, 310 and 314 of $Al_xGa_{1-x}As$ in accordance with the invention can increase their respective barrier heights 340-347 without incurring additional strain or gain suppression.

An embodiment in accordance with the invention such as quantum well structure 300 shown in FIG. 3A has abrupt interfaces between quantum well layers 304, 308 and 312 that are interleaved with barrier layers 302, 306, 310 and 314. The abrupt interfaces are due to the InGaAs of quantum well layers 304, 308 and 312 and the barrier layers 302, 306, 310 and 314 of $Al_xGa_{1-x}As$ (with varying percentages of Al) having the same group V sublattice. The abrupt interfaces produce good optical qualities of the quantum well 300 and limit broadening of the gain spectrum. In addition, in a quantum well structure in accordance with the invention, the abrupt interfaces between the barrier layers 302, 306, 310 and 314 of $Al_xGa_{1-x}As$ and the InGaAs quantum well layers 304, 308 and 312 have fewer defects. The reduced number of defects reduces the incidence of non-radiative recombination.

Within FIG. 3B, multiple quantum well structure 300 is composed of N InGaAs quantum well layers (e.g., 304, 308 and 312) interleaved with (N+1) $Al_xGa_{1-x}As$ barrier layers (e.g., 302, 306, 310 and 314), where N is an integer. Compared with a single quantum well structure, multiple quantum well structure 300 inherently provides an increased carrier capture rate ($\gamma_{capture}$) since it has more quantum wells to capture the carriers. Additionally, in a multi-quantum well structure, each of the quantum wells is close to its transparency carrier density when the device reaches threshold. Thus, each quantum well is typically operating close to its differential gain maxima.

For a VCSEL to lase, the optical gain of the VCSEL must overcome the VCSEL's optical loss. The quantum well structure uses material gain to compensate for the optical loss. In a single quantum well structure, the single quantum well must deliver all the material gain needed to compensate for the optical loss. Producing the high material gain leads to a lower differential gain for a single quantum well.

In a multiple quantum well structure, such as multiple quantum well structure 300 shown in FIG. 3B, the material gain is shared among the quantum wells. Each quantum well in a multiple quantum well structure need not have as high a material gain as the quantum well of a single quantum well structure. Since each quantum well in a multiple quantum well structure provides less material gain, the quantum well can operate at a lower carrier (and therefore current) density. Operating in the lower carrier density part of the material gain vs. carrier density characteristic results in each of the quantum wells operating with higher differential gain and with lower carrier leakage. Additionally, the optical confinement factor for the transverse electric field typically attains an optimal value for a multi quantum well structure. Thus, a significant performance improvement can be expected from increasing the number of quantum wells. Additionally, by implementing $Al_xGa_{1-x}As$ barrier layers with varying percentages of Al, it results in producing different barrier energy heights.

A typical VCSEL is caused to lase by passing a current through the VCSEL. Current injection causes the quasi-Fermi level of the conduction band in the energy diagram 380 shown in FIG. 3B to rise towards the band edge of the $Al_xGa_{1-x}As$ barrier layers 302, 306, 310 and 314. This increases the escape rate of electrons. However, in multiple quantum well structure 300, the quasi-Fermi level can be closer to the band edge due to the above-described lower material gain of the quantum wells. For a given carrier density, the differential gain of each quantum well is maximized as the quasi-Fermi levels move toward the band edge. Using $Al_xGa_{1-x}As$ as the material of barrier layers 302, 306, 310 and 314 increases their respective barrier heights 340-347 provided by the quantum wells 304, 308 and 312. This reduces the rate at which captured electrons escape from quantum well layers 304, 308 and 312.

Also, as described above, the increased band gap energy of the $Al_xGa_{1-x}As$ barrier layers 302, 306, 310 and 314 allows the thicknesses of both the InGaAs quantum well layers 304, 308 and 312 and the $Al_xGa_{1-x}As$ barrier layers to be reduced without impairing the differential gain. The increase in carrier confinement resulting from the increased band gap energy of the $Al_xGa_{1-x}As$ barrier layers 302, 306, 310 and 314 offsets the reduction in carrier confinement resulting from decreasing the thickness of the quantum well layers 304, 308 and 312. The reduction in thicknesses of the quantum well layers and barrier layers increases the separation between allowed energy levels of the quantum wells. For VCSELs of similar dimensions, this leads to an improvement in the differential gain due to the increased carrier capture provided by the greater number of quantum wells in the same space. The optical confinement factor is also enhanced by the use of multiple quantum wells.

A VCSEL incorporating multiple quantum well structure 300 provides advantages over a VCSEL having a single quantum well structure. For example, the multiple quantum well structure has a greater carrier capture rate ($\gamma_{capture}$). In addition, the multiple quantum well structure has a lower carrier escape rate ($\gamma_{escape}$) due to each quantum well having a lower material gain, and the resulting increased barrier height $\Delta E_c$. In combination, these factors provide a greater carrier confinement factor, which leads to better carrier confinement, increased differential gain, and ultimately the multiple quantum well VCSEL having a greater maximum modulation speed.

Figure 3C:
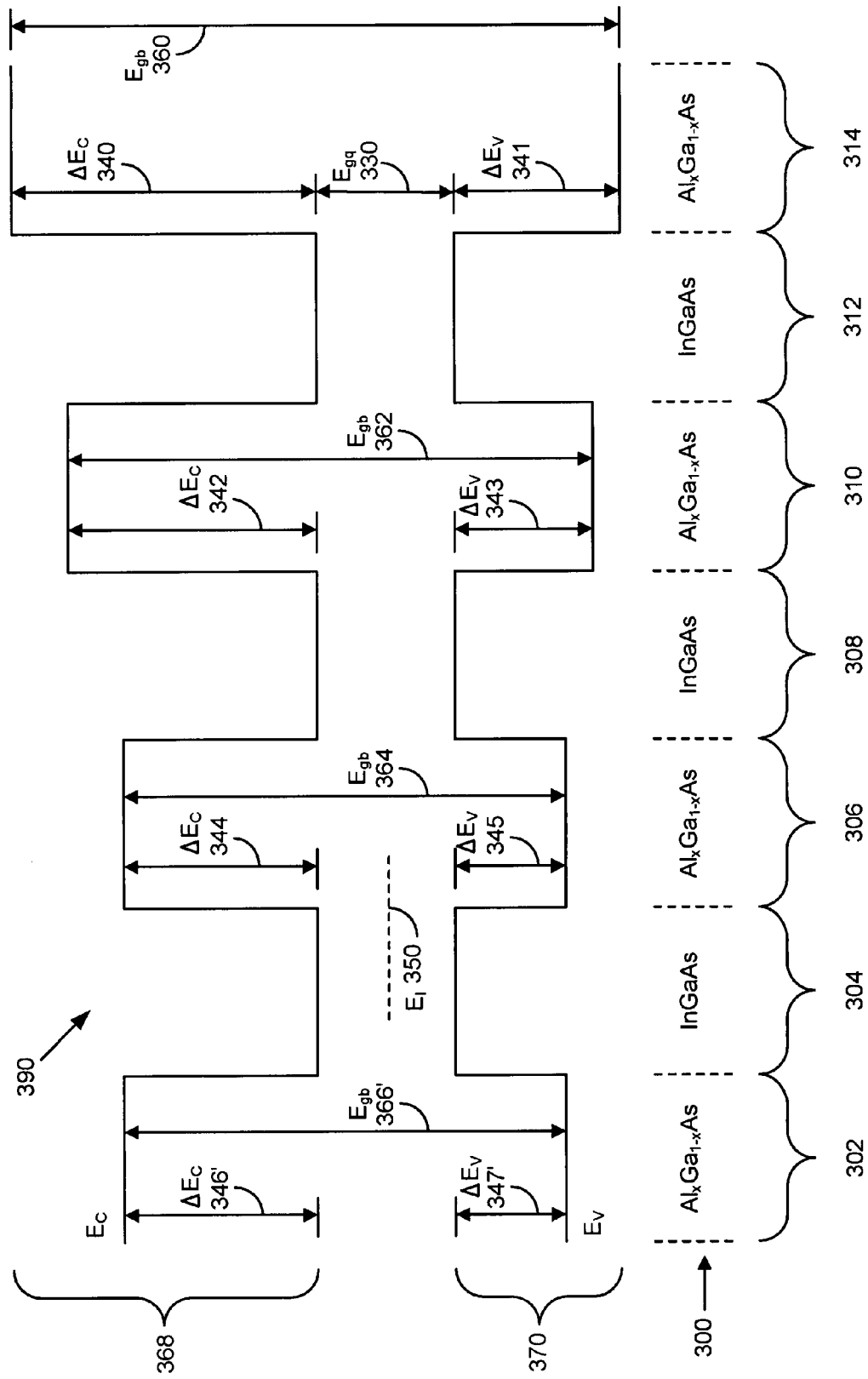
FIG. 3C is an energy diagram in accordance with another embodiment of the invention of the quantum well structure shown in FIG. 3A.

FIG. 3C is an energy diagram 390 illustrating the band energy profile of quantum well structure 300 shown in FIG. 3A in an embodiment in accordance with the invention. Note that an n-type spacer layer (e.g., 123) can be located to the left of barrier layer 302 while a p-type spacer layer (e.g., 127) can be located to the right of barrier layer 314. It is appreciated that energy diagram 390 is similar to the energy diagram 380 of FIG. 3B. However, energy diagram 390 illustrates that $Al_xGa_{1-x}As$ barrier layers 302 and 306 can be formed of substantially the same percentage Al such that they have substantially the same barrier energy height.

Specifically, the energy diagram 390 shows that the band gap energy $E_{gb}$ 366' for barrier layer 302 can be substantially the same as the band gap energy $E_{gb}$ 364 for barrier layer 306. The energy diagram 390 also shows that the barrier height $\Delta E_c$ 346' associated with the conduction band of barrier layer 302 can be substantially the same as the barrier height $\Delta E_c$ 344 associated with the conduction band of barrier layer 306. The energy diagram 390 further shows that the barrier height $\Delta E_v$ 347' associated with the valence band of the barrier layer 302 can be substantially the same as the barrier height $\Delta E_v$ 345 associated with the valence band of the barrier layer 306. It is noted that quantum well structure 300 having the band energy profile of energy diagram 390 can exhibit similar functionalities and advantages as those described herein with reference to energy diagram 380 of FIG. 3B.

Method for Improving Carrier Confinement and Hole Distribution

Figure 4:
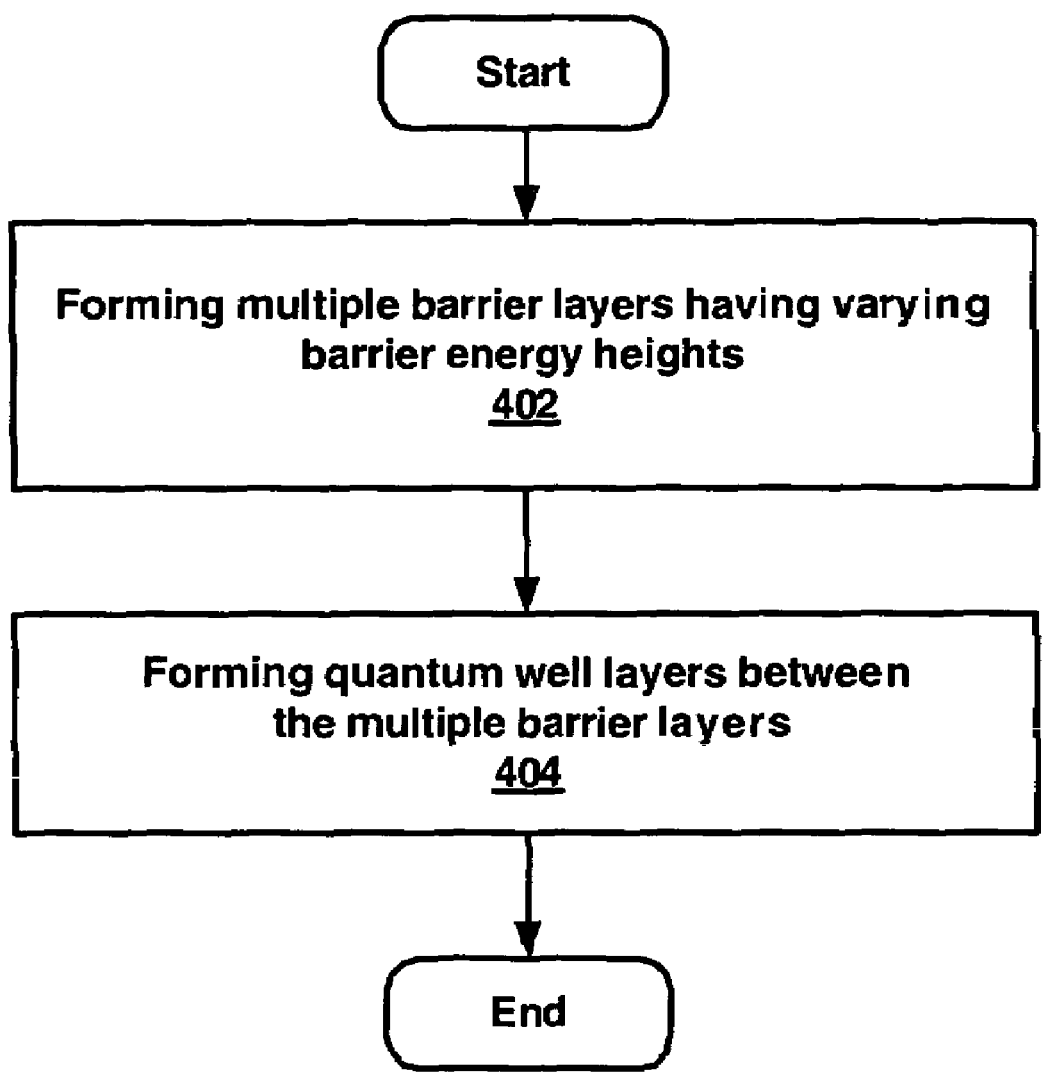
FIG. 4 is a flowchart of another method in accordance with embodiments of the invention.

FIG. 4 is a flowchart of a method 400 in accordance with the invention for increasing the modulation speed of a light-emitting device while improving hole distribution in its active region. The increased modulation speed can be due to increased carrier confinement in the quantum wells of the light-emitting device while the improved hole distribution can be due to a multiple quantum well structure having barrier layers with varying energy heights. Although specific operations are disclosed in method 400, such operations are exemplary. That is, method 400 may not include all of the operations illustrate by FIG. 4. Alternatively, method 400 may include various other operations and/or variations of the operations shown by FIG. 4. Likewise, the sequence of the operations of method 400 can be modified.

At operation 402, multiple barrier layers can be formed having varying barrier energy heights. Note that operation 402 can be implemented in a wide variety of ways. For example, in one embodiment, the multiple barrier layers at operation 402 can constitute part of an active region of a light-emitting device. In accordance with embodiments of the invention, the light-emitting device can be implemented as, but is not limited to, a VCSEL, an edge-emitting laser, or an optical amplifier such as the optical gain medium of an electrically pumped external cavity laser. Understand that that the multiple barrier layers can be formed at operation 402 in any manner similar to that described herein, but is not limited to such.

It is understood that the multiple barrier layers can be formed at operation 402 of a wide variety of materials that result in them having varying barrier energy heights. For example, if three barrier layers are formed at operation 402, a first barrier layer can be formed with $Al_xGa_{1-x}As$, a second barrier layer can be formed with GaAs, and a third barrier layer can be formed with $In_xGa_{1-x}As$. In one embodiment, the third barrier layer can be formed specifically with $In_{0.05}Ga_{0.95}As$. In another embodiment, the multiple barrier layers can be formed at operation 402 such that the barrier energy height of each formed barrier layer progressively decreases (e.g., linearly or non-linearly) from one barrier layer to the next barrier layer, and so forth. For example, the barrier energy height of each formed barrier layer successively reduces (e.g., linearly or non-linearly) from one barrier layer to the next barrier layer along the direction of injection of carriers having a lower mobility (e.g., hole or electron, depending on the material system). In another embodiment, the multiple barrier layers can be formed at operation 402 such that the barrier energy height of each formed barrier layer progressively increases (e.g., linearly or non-linearly) from one barrier layer to the next barrier layer, and so forth. In another embodiment, the multiple barrier layers can be formed at operation 402 such that the barrier energy height is different for each barrier layer. In another embodiment, the multiple barrier layers can be formed at operation 402 such that at least two of the barrier energy heights are different.

At operation 404 of FIG. 4, multiple quantum well layers can be formed such that they are interleaved between the multiple barrier layers. As such, the multiple quantum wells can be formed at operation 404 such that each quantum well layer is sandwiched between a pair of barrier layers. Note that operation 404 can be implemented in a wide variety of ways. For example, in one embodiment, the multiple quantum well layers at operation 404 can constitute part of the active region of the light-emitting device. In accordance with the invention, the light-emitting device can be implemented as, but is not limited to, a VCSEL, an edge-emitting laser, or an optical amplifier such as the optical gain medium of an electrically pumped external cavity laser. The multiple quantum well layers can be formed at operation 404 of a wide variety of materials and are not limited in any way to that described herein. Furthermore, each quantum well layer can be formed at operation 404 from a different material. It is understood that the multiple quantum well layers can be formed at operation 404 in any manner similar to that described herein, but is not limited to such.

The foregoing descriptions of specific embodiments in accordance with the invention have been presented for purposes of illustration and description. They are not intended to be exhaustive or to limit the invention to the precise forms disclosed, and obviously many modifications and variations are possible in light of the above teaching. The invention can be construed according to the Claims and their equivalents.

What is claimed is:

1. A method comprising:
   forming barrier layers of a quantum well structure for a light emitting device, said barrier layers having successively decreasing barrier energy heights, and said barrier energy heights decreasing non-linearly; and
   forming quantum well layers of said quantum well structure between said barrier layers.

2. The method of claim 1, wherein said barrier energy heights comprise successively reduced barrier energy heights along a direction of injection of carriers having a lower mobility.

3. The method of claim 1, wherein each of said barrier layers comprises aluminum gallium arsenide (AlGaAs) and includes a different fraction of aluminum (Al).

4. The method of claim 1, wherein a barrier layer of said barrier layers comprises gallium arsenide (GaAs).

5. The method of claim 1, wherein the forming barrier layers includes forming barrier layers that are arranged by barrier height such that they form a descending gradient of successive barrier energy heights.

6. The method of claim 1, wherein the forming barrier layers includes forming barrier layers that are arranged by barrier height such that they form a tiered succession of reduced barrier energy heights.

7. A vertical cavity surface emitting laser (VCSEL) comprising:
   a quantum well structure comprising:
   a plurality of barrier layers having successively non-linearly decreasing barrier energy heights, wherein each of said barrier layers comprises indium gallium arsenide phosphide (InGaAsP); and
   a plurality of quantum well layers interleaved with said plurality of barrier layers.

8. The VCSEL of claim 7, wherein each of said barrier layers has a different fraction of indium (In).

9. The VCSEL of claim 7, wherein each of said barrier layers has a different fraction of arsenide (As).

10. The VCSEL of claim 7, wherein said quantum well structure is structured to generate light in the range of approximately 850 nm to approximately 1550 nm.

11. The VCSEL of claim 7, wherein the plurality of barrier layers are arranged by barrier height such that they form a descending gradient of successive barrier energy heights.

12. The VCSEL of claim 7, wherein the plurality of barrier layers are arranged by barrier height such that they form a tiered succession of reduced barrier energy heights.

13. A quantum well structure for a light emitting device, the quantum well structure comprising:
    a plurality of barrier layers, wherein each of said plurality of barrier layers comprises a different percentage of arsenide (As), and wherein said barrier layers have successively non-linearly decreasing barrier energy heights; and
    a plurality of quantum well layers.

14. The quantum well structure of claim 13, wherein each of said barrier layers comprises gallium arsenide (GaAs).

15. The quantum well structure of claim 13, wherein said quantum well structure generates light in the range of approximately 850 nm to approximately 1550 nm.

16. The quantum well structure of claim 13, wherein the plurality of barrier layers are arranged by barrier height such that they form a descending gradient of successive barrier energy heights.

17. The quantum well structure of claim 13, wherein the plurality of barrier layers are arranged by barrier height such that they form a tiered succession of reduced barrier energy heights.

* * * * *

UNITED STATES PATENT AND TRADEMARK OFFICE
CERTIFICATE OF CORRECTION

PATENT NO.        : 7,577,172 B2                                              Page 1 of 1
APPLICATION NO.   : 11/143374
DATED             : August 18, 2009
INVENTOR(S)       : Ashish Tandon et al.

It is certified that error appears in the above-identified patent and that said Letters Patent is hereby corrected as shown below:

Column 1, Line 4, insert --STATEMENT REGARDING FEDERALLY SPONSORED RESEARCH OR DEVELOPMENT The U.S. government has a paid-up license in this invention and the right in limited circumstances to require the patent owner to license others on reasonable terms as provided for by the terms of contract no. MDA 972-03-3-004 awarded by the Defense Advanced Research Projects Agency (DARPA) of the U.S.--.

Column 15, Line 12, Claim 2, delete "reduced" and insert --decreasing--.

Signed and Sealed this
Twenty-fifth Day of September, 2012

David J. Kappos
*Director of the United States Patent and Trademark Office*